(12) United States Patent
Komada

(10) Patent No.: US 6,599,841 B2
(45) Date of Patent: *Jul. 29, 2003

(54) METHOD FOR MANUFACTURING A SEMICONDUCTOR DEVICE

(75) Inventor: Daisuke Komada, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/342,054

(22) Filed: Jun. 29, 1999

(65) Prior Publication Data

US 2001/0003675 A1 Jun. 14, 2001

(30) Foreign Application Priority Data

Nov. 4, 1998 (JP) ............................. 10-313534

(51) Int. Cl.⁷ ..................... H01L 21/302; H01L 21/3065
(52) U.S. Cl. .................... 438/706; 438/710; 438/720; 438/725
(58) Field of Search .................. 438/710, 720, 438/725, 723, 706

(56) References Cited

U.S. PATENT DOCUMENTS

| | | | |
|---|---|---|---|
| 4,325,984 A | | 4/1982 | Galfo et al. .................. 365/10 |
| 5,003,375 A | * | 3/1991 | Ichikawa ..................... 257/757 |
| 5,405,491 A | * | 4/1995 | Shahvandi et al. ......... 156/643 |
| 5,407,862 A | * | 4/1995 | Miyamoto et al. .......... 438/653 |
| 5,422,310 A | * | 6/1995 | Ito ............................... 438/648 |
| 5,545,289 A | * | 8/1996 | Chen et al. .................. 438/694 |
| 5,575,888 A | * | 11/1996 | Kosakowski et al. ..... 156/651.1 |
| 5,609,775 A | * | 3/1997 | Liu .............................. 216/77 |
| 5,654,233 A | * | 8/1997 | Yu ............................... 438/643 |
| 5,654,234 A | * | 8/1997 | Shih et al. ................... 438/643 |
| 5,670,422 A | * | 9/1997 | Tabara ......................... 438/644 |
| 5,677,237 A | * | 10/1997 | Tsai et al. .................... 438/627 |

FOREIGN PATENT DOCUMENTS

| | | | | |
|---|---|---|---|---|
| JP | 2-190472 | 7/1990 | ........... | C23C/16/44 |
| JP | 7-14824 | 1/1995 | ....... | H01L/21/3065 |
| JP | 7-230993 | 8/1995 | ....... | H01L/21/3265 |

* cited by examiner

*Primary Examiner*—Robert Kunemund
*Assistant Examiner*—Lynette T. Umez-Eronini
(74) *Attorney, Agent, or Firm*—Armstrong, Westerman & Hattori, LLP

(57) ABSTRACT

A method for fabricating a semiconductor device including a conductive pattern having a first layer including Ti and a second layer including W is presented. The method includes the steps of patterning the conductive pattern by a dry etching and exposing the conductive pattern after the step of the patterning to a plasma containing O, thereby removing the remaining Cl which induces an aftercorrosion problem of the conductive pattern containing the Ti.

13 Claims, 12 Drawing Sheets

$$Ti \rightarrow Ti^{4+} + 4e^-$$

$$4e^- + 4H^+ \rightarrow 2H_2$$

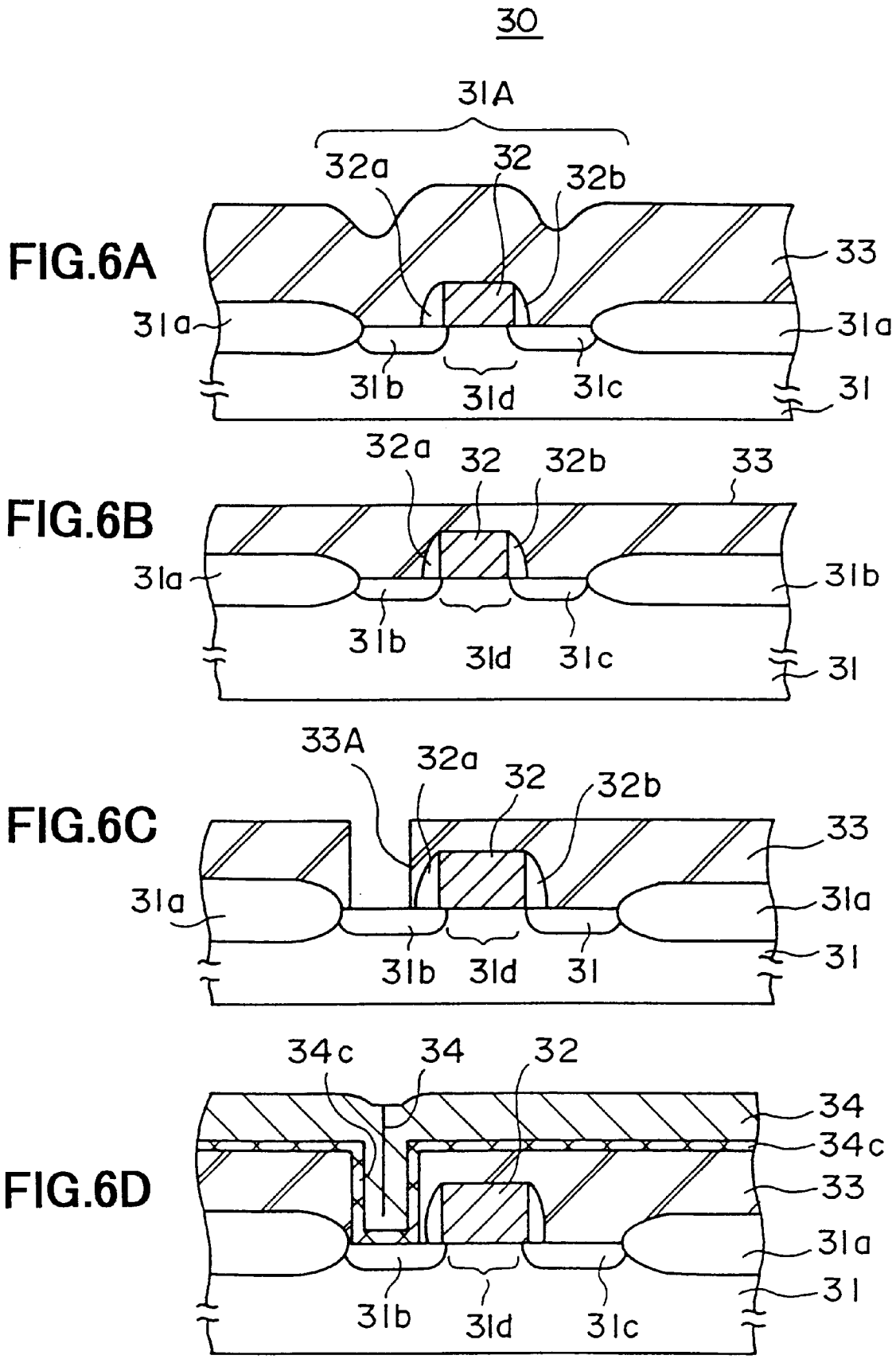

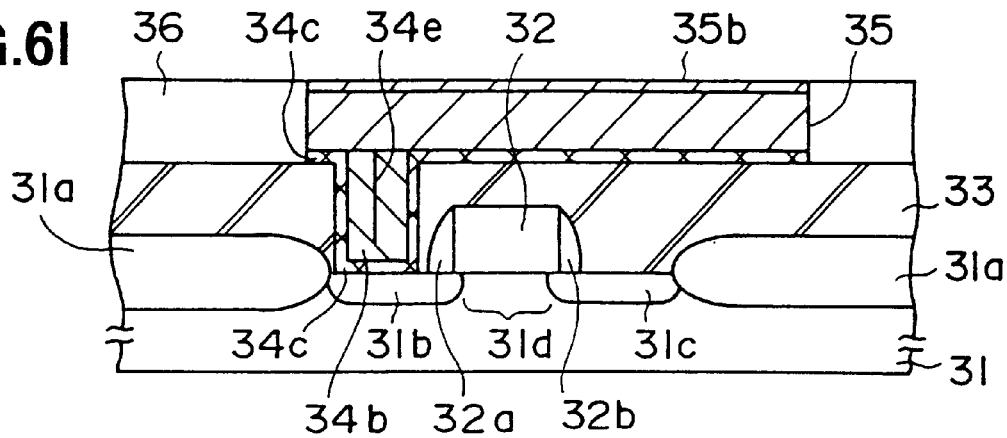
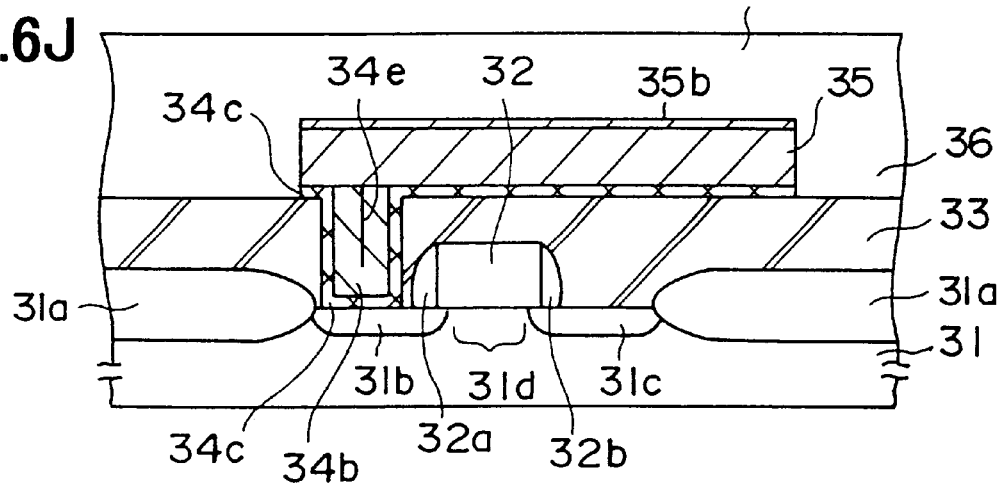
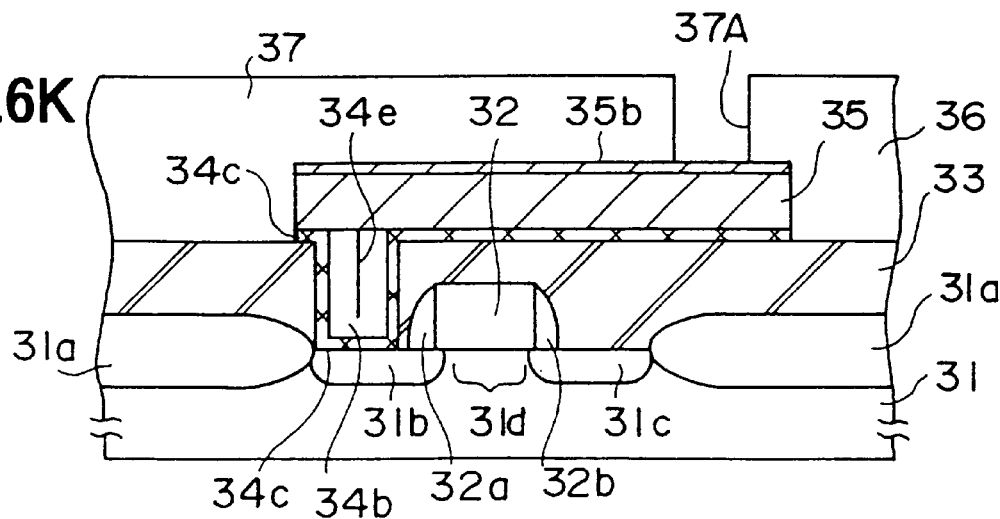

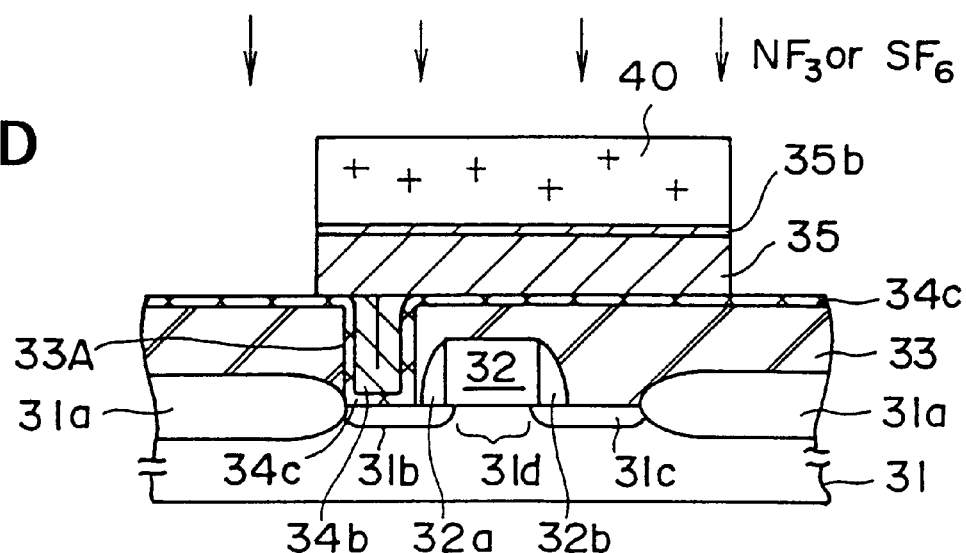
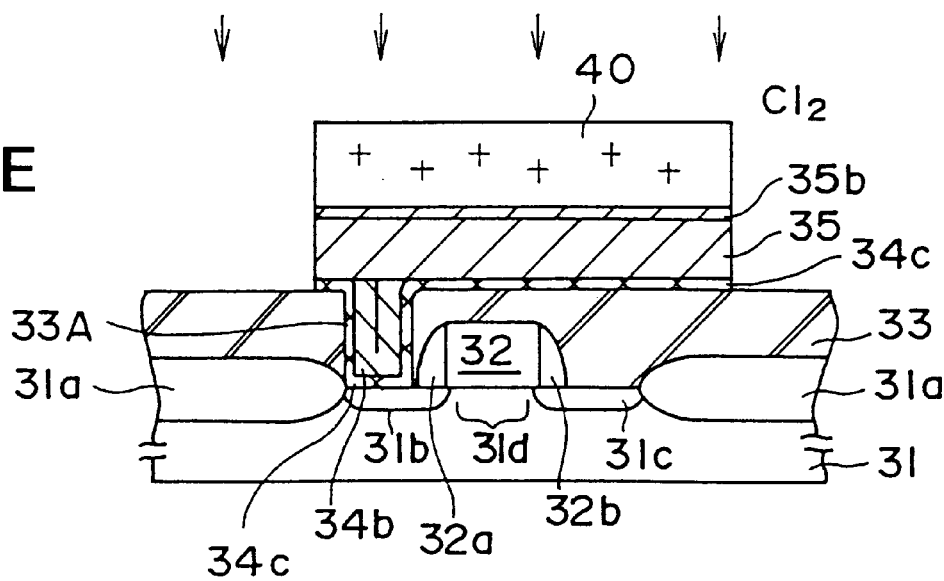
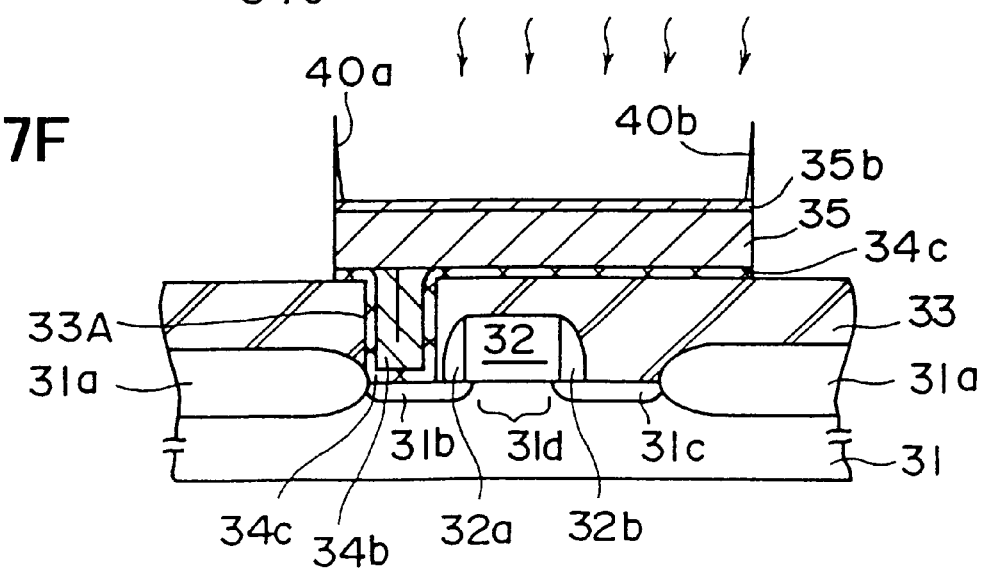

METHOD FOR MANUFACTURING A SEMICONDUCTOR DEVICE

BACKGROUND OF THE INVENTION

1. Field of the Invention

The present invention generally relates to a manufacture of a semiconductor device, and in particular to a method of manufacturing a semiconductor device with a multilayer interconnection structure.

In microfabrication of a semiconductor integrated circuit device, the semiconductor industry has utilized wiring patterns and interlayer insulating films provided alternately, that is, a multilayer interconnection structure, to interconnect a large number of semiconductor devices formed on a common substrate. In the multilayer interconnection structure, an interlayer insulating film has been formed to cover a wiring pattern and a wiring pattern, in turn, has also been formed to cover the interlayer insulating film. Furthermore, a contact hole has been provided in such an interlayer insulating film, and the wiring pattern has been formed to contact a conductive plug which fills the contact hole.

Whereas the wiring patterns are typically formed of aluminum or an aluminum alloy in the conventional multilayer interconnection structure, the wiring patterns in the recent supermicrofabrication of the semiconductor integrated circuit device are formed of tungsten (W), which has a low resistivity equivalent to aluminum, in order to avoid problems of electromigration and hillock formation. Such a W pattern has also been used as a low-resistance gate electrode of a field-effect transistor.

2. Description of the Related Art

FIG. 1 shows a structure of a typical semiconductor device 10 with a conventional multilayer interconnection structure. Referring to FIG. 1, a field oxide film 11a is formed on a silicon substrate 11 to define an active region, wherein a gate electrode 12 carrying sidewall insulating films 12a and 12b at both sidewalls thereof is formed, with a gate oxide film not shown interposed between the substrate 11 and the gate electrode 12. A channel region 11d is formed in the silicon substrate 11 in correspondence to the gate electrode 12, and diffusion regions 11b and 11c are also formed at both sides of the channel region 11d in the silicon substrate 11. An interlayer insulating film 13 is applied to cover the silicon substrate 11 in the semiconductor device 10 of FIG. 1, and a contact hole is then formed in the interlayer insulating film 13 so as to expose the diffusion region 11b. A W plug 14 is formed in the contact hole 13A with a thin conductive film 14a with a structure provided by a TiN/Ti stacked layer interposed between the contact hole 13A and the W plug 14. The TiN/Ti conductive film 14a which has a structure of a TiN film deposited on a Ti film can be patterned on the interlayer insulating film 13 according to a desired conducting pattern. Furthermore, a W pattern 15 is applied to cover the conducting film pattern 14a on the interlayer insulating film 13 in accordance with a shape of the conducting film pattern 14a. Actually, the W plug 14 can be deposited by the steps of deposition by a chemical vapor deposition (CVD) method, followed by a chemical mechanical polishing (CMP) method. The W plug 14 has a seam 14b which is formed when the deposition of the W is performed to fill the contact hole 13A. The W pattern 15 is covered with a conducting film 15a which has the same TiN/Ti stacked layer structure as the conducting film 14a, and the W pattern 15 is then covered with another interlayer insulating film 17 together with the conductive film 15a thereon. Then, a contact hole 17A is formed in the interlayer insulating film 17, by which the W pattern 15, more accurately, the conducting film 15a on the W pattern 15, is exposed. A thin conductive film 18a having the same TiN/Ti structure as the conductive film 14a or 15a is formed on the interlayer insulating film 17 to include the contact hole 17A. The contact hole 17A is filled with a W plug 18 with the conducting film 18a interposed between the contact hole 17A and the W plug 18. The W plug 18 also involves the same seam 18b as the seam 14b.

By the way, recent very advanced microfabrication, that is, the manufacture of a semiconductor device offering sub-micron line widths, has provided a decreased size of the contact hole 13A or 17A by so-called induced enhancement of an aspect ratio thereof. In such a contact hole having the high aspect ratio, the TiN/Ti film 14a or 18a originally have a thickness of only a few nanometers. A thickness ratio of the TiN/Ti film to the W plug increases due to an inability to further decrease the TiN/Ti film thickness.

When the inventors of the present invention carried out an experiment of patterning by dry etching on a stacked conducting structure having a relatively thicker TiN/Ti film as compared to a W film thickness, it was discovered in this structure that aftercorrosion, in which Ti dissolves from the TiN/Ti film after the process of the dry etching, takes place.

FIG. 2 shows a structure of a sample 20 used in a preliminary experiment which forms the basis of the present invention. Referring to FIG. 2, the sample 20 was provided on a PSG film 22 covering a silicon substrate 21. The sample 20 comprised a conductive film 23 having the TiN/Ti structure provided on the PSG film 22, a W film 24 formed on the conductive film 23, and an antireflection coating (ARC) 25 comprising SiON or an amorphous carbon provided on the W film 24. A resist pattern 26 was formed on the ARC 25. In the above experiment, the ARC 25 and the W film 24 under the ARC 25 were dry-etched as usual in a reaction chamber of a dry etching apparatus using the resist pattern as a mask and an etching gas containing F. The TiN/Ti film 23 under the W film was then dry-etched in the same reaction chamber using an etching gas including Cl. In addition, the resist pattern 26, after the etching of the TiN/Ti film 23, was removed by oxidation in an ashing apparatus. Deposition products including rabbit ears and the like remaining on the sidewalls of the resulting pattern were then dissolved and removed by an alkaline solution in a wet etching apparatus. However, it was discovered that the resulting conductive pattern was subjected to aftercorrosion, as shown in SEM photographs of FIGS. 3A and 3B indicated by a white circle, when the pattern was allowed to stand in the air. It is known with reference to a sectional SEM photograph in FIG. 3C that a portion subjected to aftercorrosion corresponds to the TiN/Ti film. If the wiring pattern in a multilevel interconnection structure is sujected to aftercorrosion, reliability of the overall semiconductor device will be reduced.

Specifically, the results of FIGS. 3A–3C were obtained from a sample having a TiN/Ti film 23 thickness of 100 (40/60) nanometers, a W film 24 thickness of 100 nanometers, and an ARC 25 comprising SiON with a film thickness of 32 nanometers. The ARC 25 and the W film 24 under the ARC 25 were dry-etched by a method of reactive ion etching (RIE) using a mixture gas of $NF_3$ and Ar as the etching gas in the reaction chamber of a parallel-plate dry etching apparatus. The TiN/Ti film 23 under the W film was then dry-etched using $Cl_2$ as the etching gas in the same reaction chamber. In the above experiment, after the dry etching of the TiN/Ti film 23, the resist pattern was removed by an ashing process using an ultraviolet radiation excited oxygen plasma (UVEO plasma) in the same reaction chamber. The resulting structure was transferred to the wet etching apparatus, and the remaining deposition products, such as the rabbit ears and the like, were removed by an alkaline developing solution based on amines. In other words, in this experiment, after the ashing process of the resist pattern 26, the conductive pattern was exposed to the air during the transfer stage from the dry etching apparatus to the wet etching apparatus. FIGS. 3A–3C show the resulting conductive pattern which was subjected to exposure to the air for 10 minutes.

SUMMARY OF THE INVENTION

It is a general object of the present invention to provide a novel and useful method for manufacturing a semiconductor device which solves the above problems.

A more specific object of the present invention is to provide a method for manufacturing a semiconductor device which can inhibit aftercorrosion of a W pattern in the semiconductor device including the W pattern formed by a dry etching.

The above objects of the present invention are achieved by a method for fabricating a semiconductor device including a conductive pattern comprising a first layer including Ti and a second layer including W provided on the first layer, the method comprising the steps of patterning the conductive pattern by a dry etching; and exposing the conductive pattern after the step of the patterning to a plasma containing O.

The above objects of the present invention are achieved by a method for fabricating a semiconductor device including a conductive pattern comprising a first layer including Ti and a second layer including W provided on the first layer, the method comprising the steps of patterning the conductive pattern by a dry etching; and exposing the conductive pattern after the step of the patterning to a plasma based on H.

The above objects of the present invention are achieved by a method for fabricating a semiconductor device including a conductive pattern comprising a first layer including Ti and a second layer including W provided on the first layer, the method comprising the steps of patterning the conductive pattern by a dry etching; and exposing the conductive pattern after the step of the patterning to a plasma including F.

According to the present invention, when the conductive film including the W film provided on the conductive film containing the Ti is dry-etched, the remaining $Cl_2$ at the time of completion of dry etching of the conductive film containing the Ti following the dry etching of the conductive film including the W can be removed without an additional plasma treatment, thereby avoiding an aftercorrosion problem of the conductive film containing the Ti due to a battery effect between the conductive film containing the Ti and the conductive film including the W.

BRIEF DESCRIPTION OF THE DRAWINGS

Other objects, features and advantages of the present invention will become more apparent from the following detailed description when read in conjunction with the accompanying drawings, in which:

FIGS. 6A–6M show manufacturing steps of the semiconductor device in one embodiment according to the present invention;

FIGS. 7A–7F illustrate the steps from FIGS. 6F to 6G in more detail.

DESCRIPTION OF THE PREFERRED EMBODIMENTS

Figure 1:
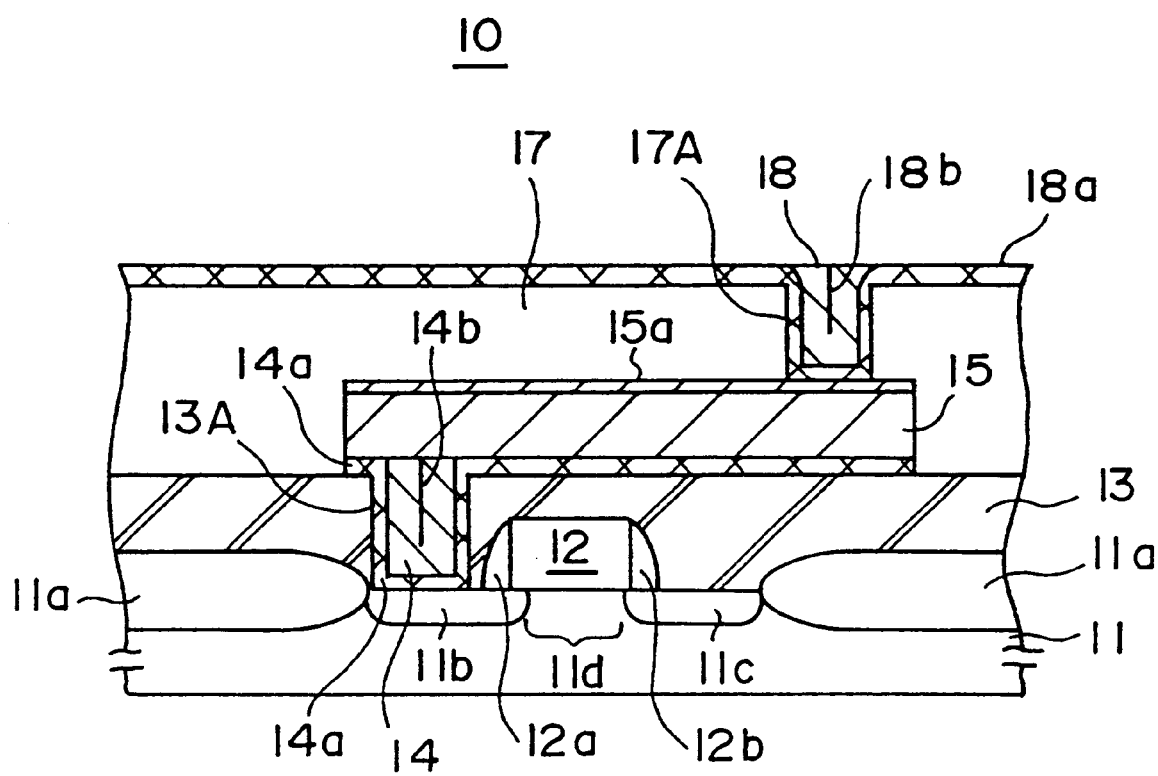
FIG. 1 shows a structure of a semiconductor device with a conventional multilayer interconnection structure.
Figure 2:
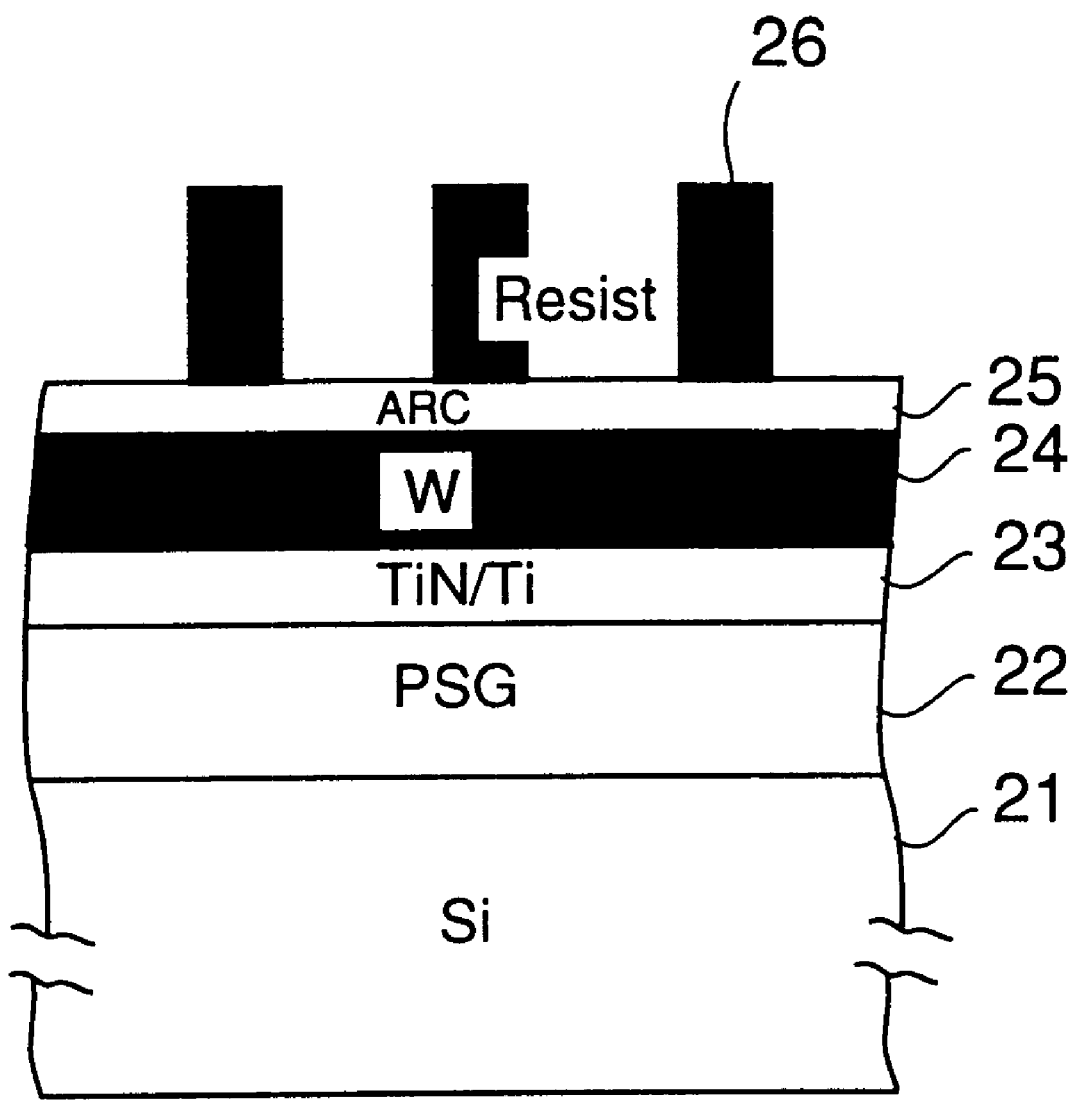
FIG. 2 shows a structure of a sample used in a preliminary experiment which forms the basis of the present invention.
Figure 4A:
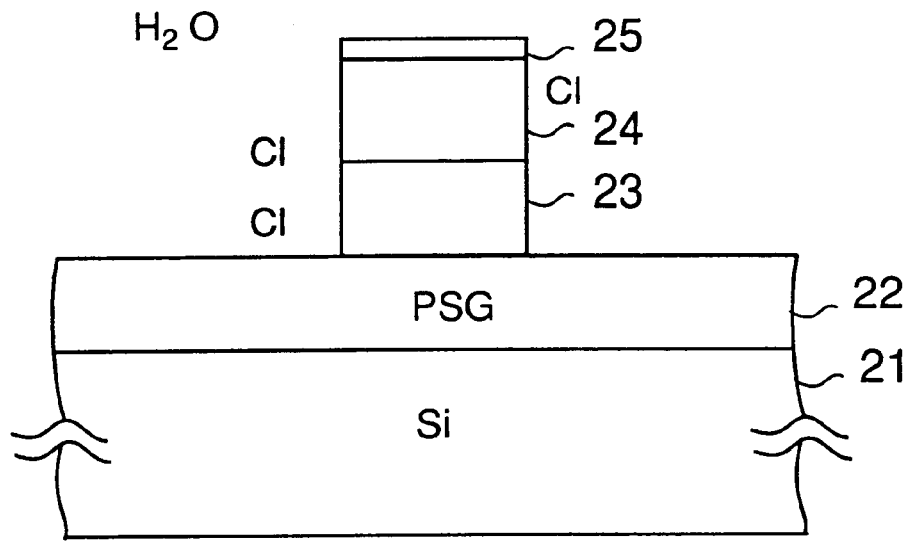
FIGS. 4A and 4B illustrate a mechanism of a phenomenon discovered in the preliminary experiment which forms the basis of the present invention.
Figure 4B:
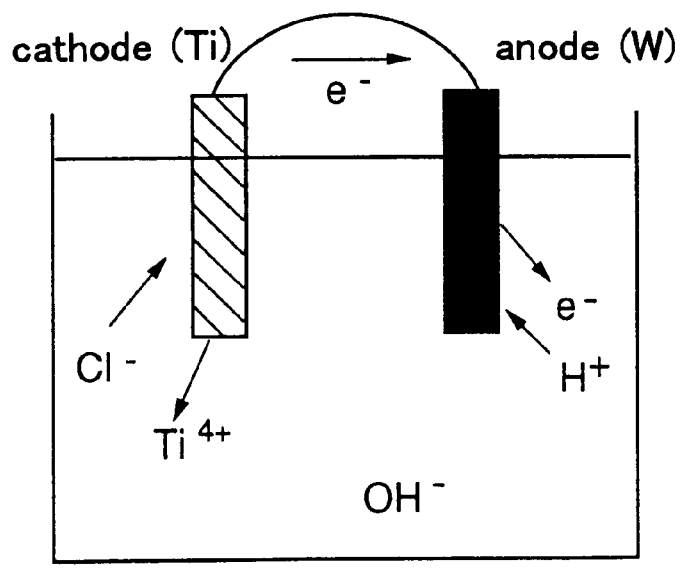

With reference to FIGS. 4A and 4B, the outline of the present invention will be described in the following. FIG. 4 shows a conductive pattern right after dry etching of the sample 20 of FIG. 2. Referring to FIG. 4A, Cl or $Cl_2$ remain on sidewalls of the conductive pattern comprising a W film 24 and a TiN/Ti film 23, which sidewalls are formed by the patterning process. When the above structure is allowed to stand in the air, the folowing oxidation-reduction reaction of the remaining $Cl_2$ with the TiN/Ti film 23 occurs:

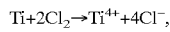

that is,

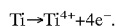

In addition, the following oxidation-reduction reaction of the resulting Cl with the W film 24 is produced:

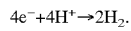

Figure 3A:
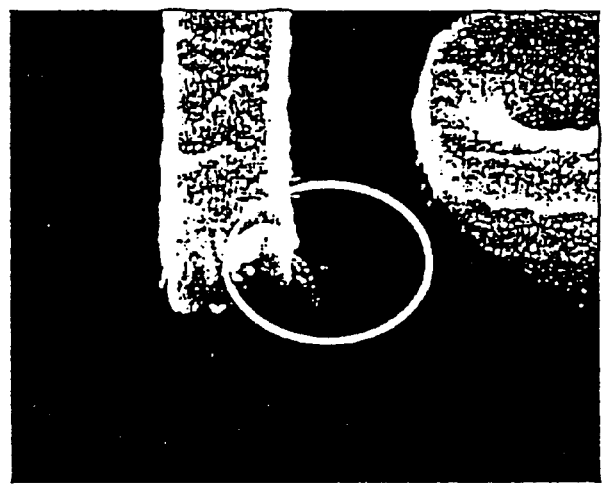
FIGS. 3A–3C illustrate a problem discovered in the preliminary experiment which forms the basis of the present invention.
Figure 3B:
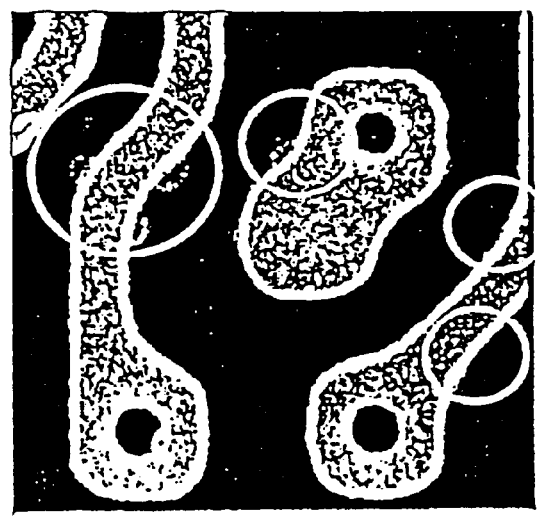
Figure 3C:
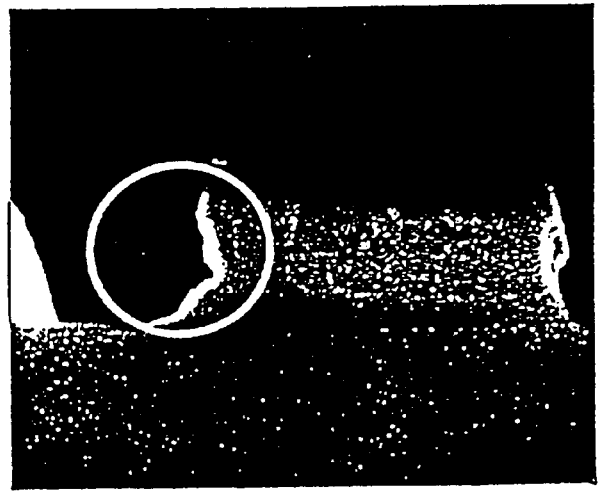

These reactions are similar to a battery reaction as shown in FIG. 4B. The TiN/Ti film 23 as a cathode releases electrons to form $Ti^{4+}$. On the other hand, the W film 24 as an anode captures the electrons from the TiN/Ti film 23 through an interface between the films 23 and 24 to produce hydrogen gas by reduction. If the above reactions take place, the $Ti^{4+}$ formed at the cathode dissolves in $H_2O$ around the film 23. The W layer 24 does not dissolve in $H_2O$ due to a high value of the ionization potential for W. As noted in the SEM photographs of FIGS. 3A–3C, only the TiN/Ti film 23 is selectively subjected to corrosion. Because aftercorrosion as described in FIGS. 3A–3C is regarded as action of the battery as shown in FIG. 4B, the remaining $Cl_2$ right after the dry etching of the conductive pattern as shown in FIG. 4A is removed from a surface of the conductive pattern by exposing the formed conductive pattern to a plasma including O (oxygen), H (hydrogen), or F (fluorine). As a result, aftercorrosion does not occur even if the resulting structure is allowed to stand in the air due to the removal of the Cl or $Cl_2$ from the surface of the conductive pattern.

Figure 5:
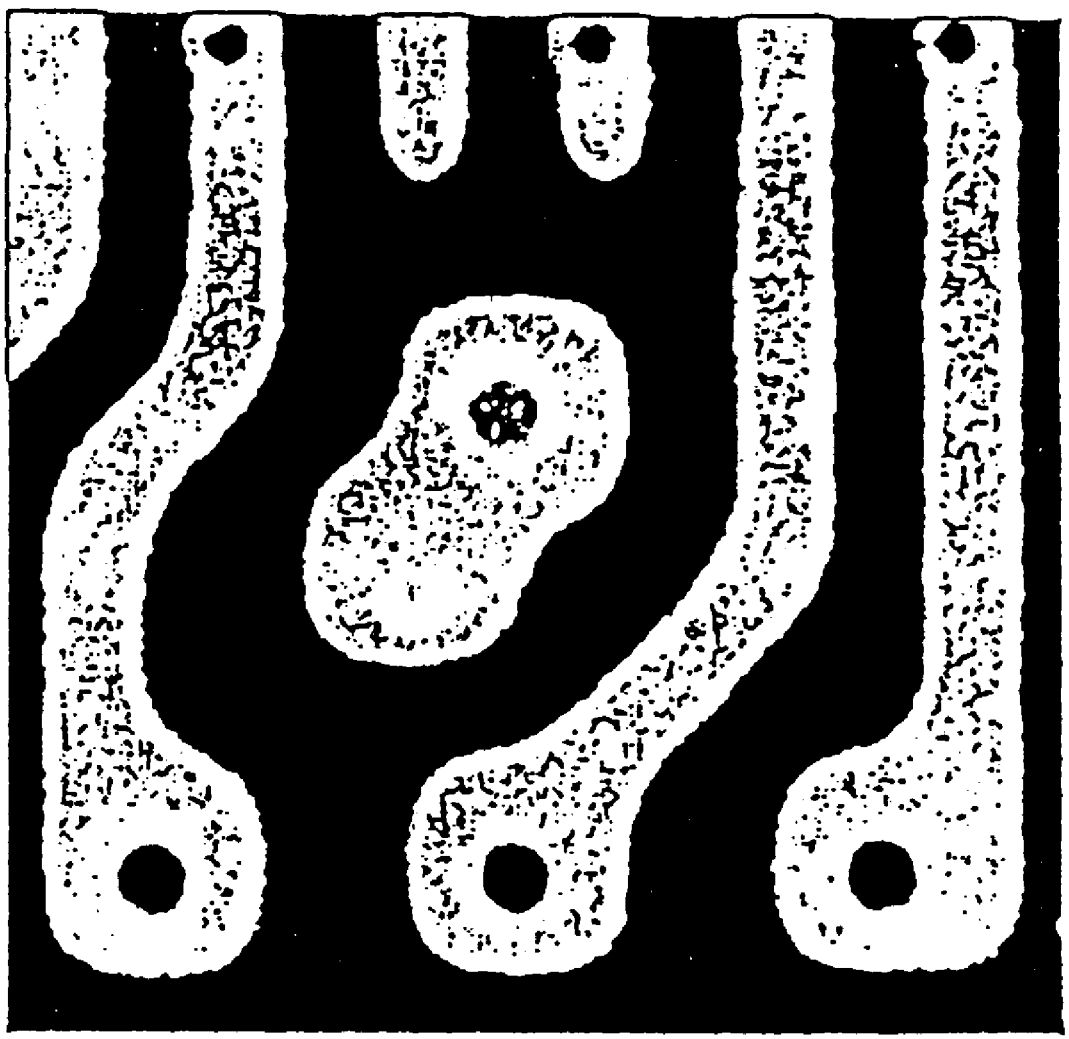
FIG. 5 shows a conductive pattern provided by a method in accordance with the present invention.

FIG. 5 shows the conductive pattern formed together with the above resist pattern 26 in the previous same reaction chamber of the parallel-plate dry etching apparatus to produce the conductive pattern similar to those of FIGS. 3A–3C. This conductive pattern was formed by exposure to $O_2$ or $O_3$ plasma including oxygen with an electron density of about $10^9$–$10^{11}$ cm$^{-3}$ using conventional oxygen RIE method instead of the UVEO plasma in the above reaction chamber, followed by removal of deposition products like rabbit ears by using an alkaline solution based on amines in the reaction chamber of a wet etching apparatus. In the experiment of FIG. 5, an ARC 25 and a W film 24 under the ARC 25 were dry-etched by the RIE method in the reaction chamber of the parallel-plate dry etching apparatus with a gas mixture of $NF_3$ and Ar as the etching gas. A TiN/Ti film 23 was then dry-etched by the RIE method in the same chamber with $Cl_2$ as the etching gas. After the dry etching step of the TiN/Ti film 23, the step of exposing to the oxygen plasma was successively accomplished in the same reaction chamber of the parallel-plate dry etching apparatus. Furthermore, FIG. 5 shows the conductive pattern after allowing the resulting pattern to stand in the air for 10 minutes.

It is known from FIG. 5 that no aftercorrosion occurred, although the conductive pattern formed by the method in accordance with the present invention was allowed to stand in the air for 10 minutes. This indicates that $Cl_2$ remaining on the surface of the conductive pattern as shown FIG. 4A can be replaced by $O_2$ by the step of exposing to plasma of $O_2$ or $O_3$ in the reaction chamber of the parallel-plate dry etching apparatus. In this case, a battery effect of FIG. 4B does not occur, because an oxide film is formed on the exposed surface of the TiN/Ti film 23.

In the ashing process using oxygen plasma, although the electron density of the source plasma is very high, oxygen plasma does not reach near the substrate. The electron density of the plasma is thus substantially zero near the substrate. In other words, the effect of the present invention can not be obtained in the ashing process using conventional oxygen plasma. Thus, another etching gas containing, for example, F, such as $SF_6$, is available for the dry etching of the ARC 25 and the W film 24 in the present invention.

In addition, the conductive pattern of FIG. 4A in the present invention may be exposed to a plasma including H gases, such as $H_2$, $H_2O$, $NH_3$, $CH_4$ and the like or a mixture thereof, instead of the plasma including oxygen gases, such as $O_2$, $O_3$ and the like. In this case, H in the plasma can react with the remaining Cl to give a volatile HCl. This is because the remaining $Cl_2$ is removed in the form of HCl. The electron density of the plasma in the hydrogen plasma is preferably more than $10^9$ to $10^{10}$ cm$^{-3}$ in order to perform an effective removal of the remaining Cl.

In addition, the conductive pattern of FIG. 4A in the present invention may be exposed to a plasma including F gases, such as $NF_3$ or $SF_6$ and the like, or Freon gases, such as $CF_4$, $CHF_3$, $C_2F_6$, $CH_2F_2$, $C_4F_8$ and the like, instead of the plasma including the oxygen or the hydrogen. In this case, the remaining $Cl_2$ is replaced by F in the plasma. The electron density of the plasma in the fluorine plasma is preferably more than $10^9$–$10^{10}$ cm$^{-3}$ so as to carry out an effective removal of the remaining Cl. When using a Freon gas as the plasma gas, it may be preferable to utilize Freon gas which is of a general formula $C_xH_yF_z$ ($x \geq 1$, $y \geq 0$, $Z \geq 1$) and does not include elements, such as Cl, Br, or I, which are likely to induce the battery effect. Each of the above plasma gases can also be diluted with inert gases, such as Ar, He, $N_2$, and the like.

Figure 6E:
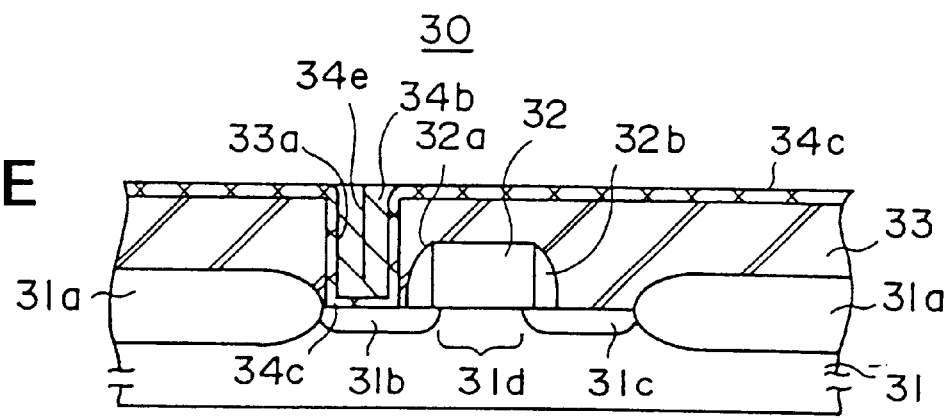

FIGS. 6A–6M illustrate the manufacturing steps for a semiconductor device according to one embodiment of the present invention. Referring to FIG. 6A, a field oxide film 31a is formed on a silicon substrate 31 to define an active region 31A. A gate electrode 32 is then formed in the active region 31A with a gate insulating film interposed between the substrate 31 and the gate electrode 32. Diffusion regions 31b and 31c are also formed at both sides of the gate electrode 32 in the substrate 31, and a channel region 31d is then formed just below the gate electrode 32 carrying sidewall oxide films 32a and 32b at both sidewalls thereof. An interlayer insulating film 33 comprising, for example, $SiO_2$ is deposited to cover the gate electrode 32 on the substrate 31. As shown in FIG. 6A, the interlayer insulating film 33 has an uneven surface with respect to the gate electrode 32. In the present embodiment, the surface of the interlayer insulating film 33 is polished and planarized by a CMP method in the step of FIG. 6B. A contact hole 33A is then formed to expose the diffusion region 31b in the planarized interlayer insulating film 33 in the step of FIG. 6C. A TiN/Ti film 34c and a W film 34 are deposited on the structure of FIG. 6C by means of a sputtering method and a CVD method, respectively, in the step of FIG. 6D. The resulting W film 34 is removed by the CMP method in the step of FIG. 6E to produce a W plug in the contact hole 33A, as shown in FIG. 6E. However, the TiN/Ti film 34c cannot be removed by the CMP method, and, thus, is left. A seam 34e which is formed during the deposition of the W film 34 in the step of FIG. 6D, is located in the center of the W plug 34b. The TiN/Ti film 34c and the W film 34 are formed in the step of FIG. 6D to have, for example, a TiN film thickness of 40 nanometers, a Ti film thickness of 60 nanometers, and a W film thickness of 100 nanometers.

Figure 6F:
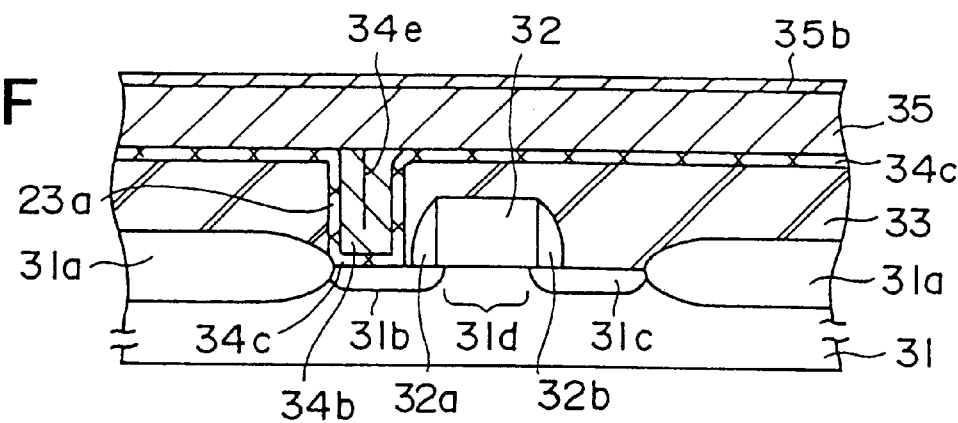

A conductive film 35 comprising W is then deposited on the structure of FIG. 6E by the CVD method to about a 100-nanometer thickness in the next step of FIG. 6F. A TiN/Ti film 35b is then deposited on the conductive film 35 by sputtering or the CVD method to have a similar composition to the TiN/Ti film 34c with 40-nanometer and 60-nanometer film thicknesses, respectively. The W film 35, and TiN/Ti films 35b and 34c above and below the W film 35 are patterned using a resist pattern as a mask in the step of FIG. 6G. An interlayer insulating film 36 comprising, for example, $SiO_2$, is then deposited on the structure of FIG. 6G in the step of FIG. 6H.

Figure 6G:
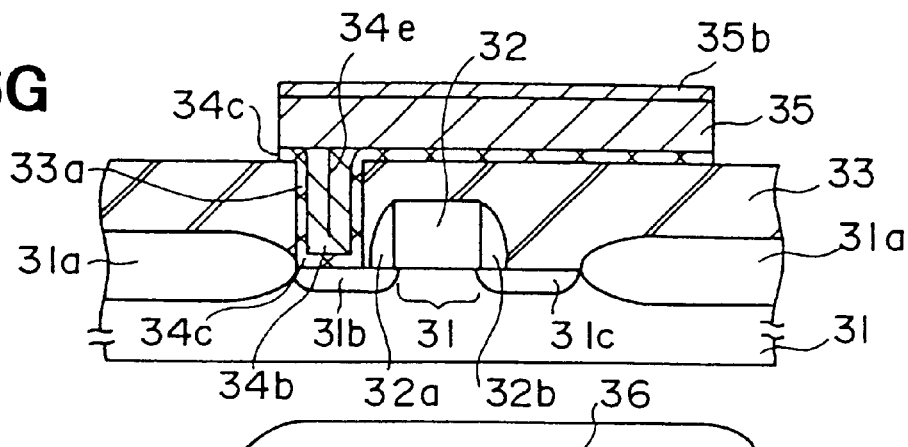
Figure 7A:
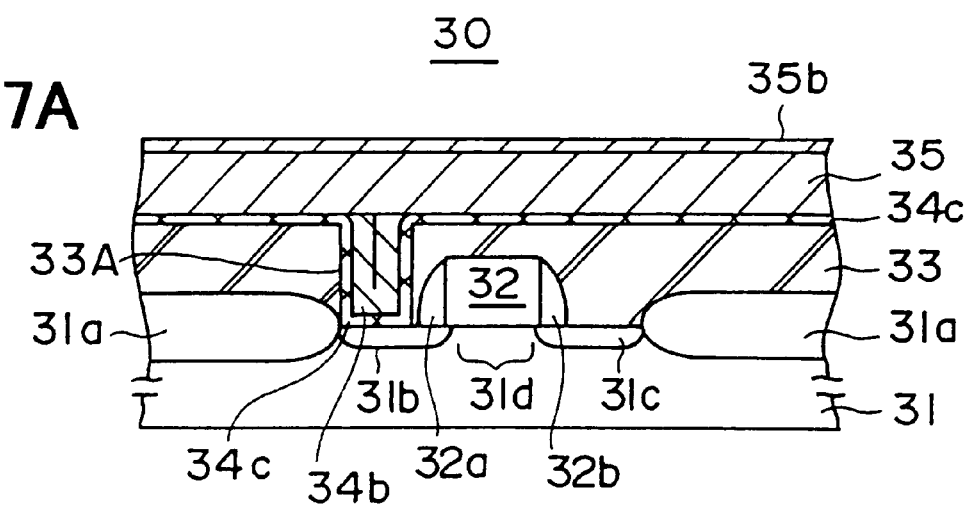
Figure 7B:
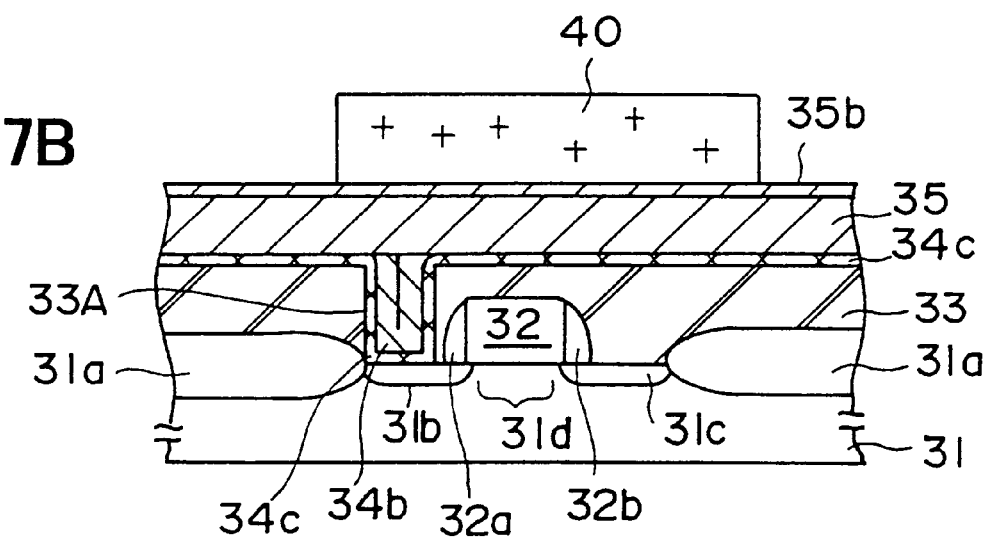
Figure 7C:
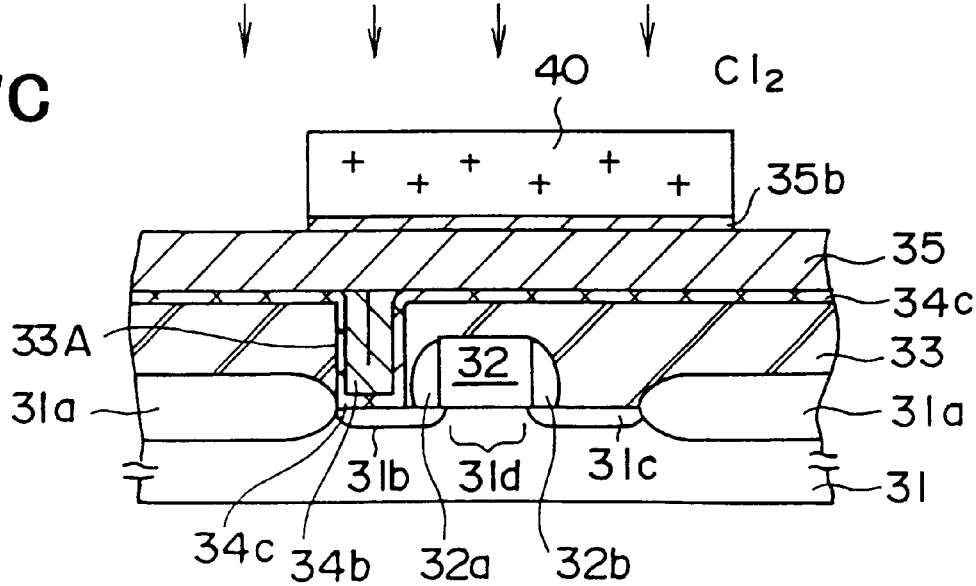

FIGS. 7A–7F and FIG. 8 illustrate the steps from FIG. 6F to FIG. 6G in more detail. FIG. 7A corresponds to FIG. 6F, and a resist pattern 40 is formed according to a W pattern to be produced on the W layer 35 in the step of FIG. 7B following the step of FIG. 7A. In the step of FIG. 7C, the structure of FIG. 7B is then introduced into a dry etching apparatus to subject the TiN/Ti film 35b to patterning by the RIE method based on $Cl_2$ etching gas using the resist pattern 40 as the mask. In the step of FIG. 7D, the W film 35 of FIG. 7C is then patterned by the RIE method based on a gas mixture of $NF_3$ and Ar or $SF_6$ and Ar as the etching gas using the resist pattern 40 as the mask in the same dry etching apparatus as the step of FIG. 7C. In the step of FIG. 7E following the step of FIG. 7D, the TiN/Ti film 34c is then patterned by the RIE method based on $Cl_2$ etching gas using the resist pattern 40 as the mask in the same dry etching apparatus.

Figure 8:
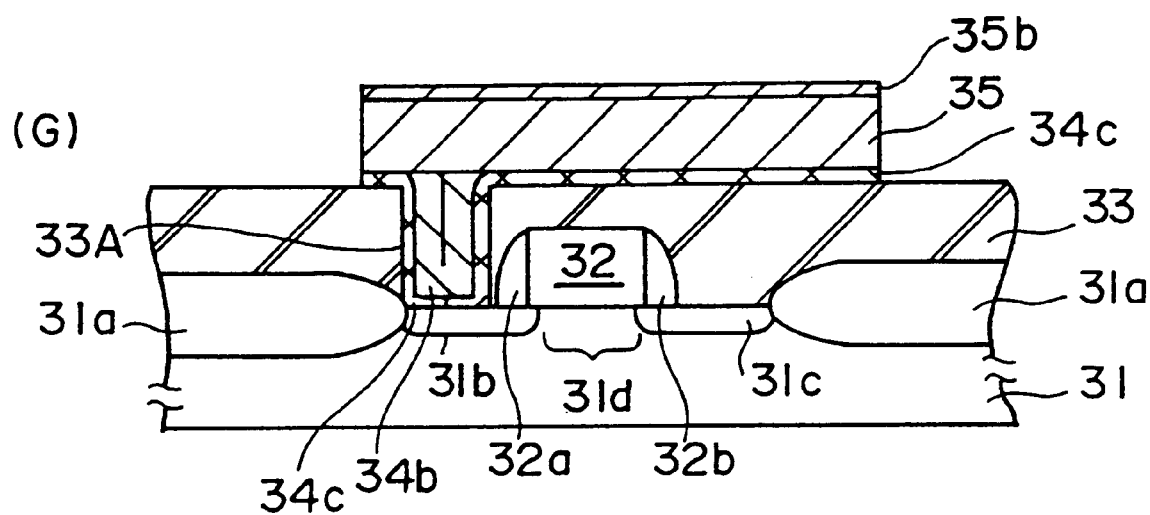
FIG. 8 shows a manufacturing step of the semiconductor device according to the one embodiment of the present invention.

In the step of FIG. 7F of the present embodiment invention, the resist pattern 40 is removed in the same dry etching apparatus with plasma of $O_2$ or $O_3$ having the electron density of about $10^9$–$10^{10}$ cm$^{-3}$, which is a conventinal oxygen RIE method. In this embodiment, $Cl_2$ attaching on the sidewalls of the W pattern 35 and the TiN/Ti film 34c under the W pattern 35 is completely replaced by $O_2$ by using the above plasma density. In the step of FIG. 8, the rabbit ears are formed from the deposits 40a and 40b provided on the sidewalls of the resist pattern 40 when the resist pattern 40 is removed. In the next step of FIG. 7G, the structure of the FIG. 7F is removed from the dry etching apparatus, and transferred into a wet etching apparatus in order to remove the rabbit ears.

Alternatively, in the step of FIG. 7F of this embodiment, the resist pattern may be subjected to the ashing process by the plasma in a gas including hydrogen, such as $H_2$, $H_2O$, $NH_3$, $CH_4$, or a mixture thereof, instead of the plasma including oxygen. In this case, $Cl_2$ remaining on the exposed portions of the W pattern 35 or TiN/Ti pattern 34c and 34c below the W pattern 35 reacts with H in the plasma to give a volatile HCl, thereby removing the remaining $Cl_2$. When using the plasma including hydrogen, it may be preferable to have the electron density of about $10^9$–$10^{10}$ cm$^{-3}$ in the above plasma treatment.

Alternatively, in the step of FIG. 7F of the this embodiment, the ashing treatment may be accomplished with plasma in the etching gas, such as $NF_3$, $SF_6$, $CF_4$, $CHF_3$, $C_2F_6$, $CH_2F_2$, $C_4F_8$, or a mixture thereof instead of the plasma including the oxygen. In this case, $Cl_2$ remaining on the exposed portions of the W pattern 35 or TiN/Ti film 34c below the W pattern 35 is replaced by F in the plasma. When using such a plasma including F, it may be preferable to have the electron density of about $10^9$–$10^{10}$ cm$^{-3}$ in the above plasma treatment. In the above gases, $NF_3$ and $SF_6$ are employed for the dry etching of the W layer. It is not necessary to prepare special gases in case of the dry etching of the step of FIG. 7F. Furthermore, $CF_4$, $CHF_3$, $C_2F_6$, $CH_2F_2$, $C_4F_8$ are Freon gas represented by the general formula $C_xH_yF_z$ ($x \geq 1$, $y \geq 0$, $z \geq 1$) which is commercially available.

Figure 6H:
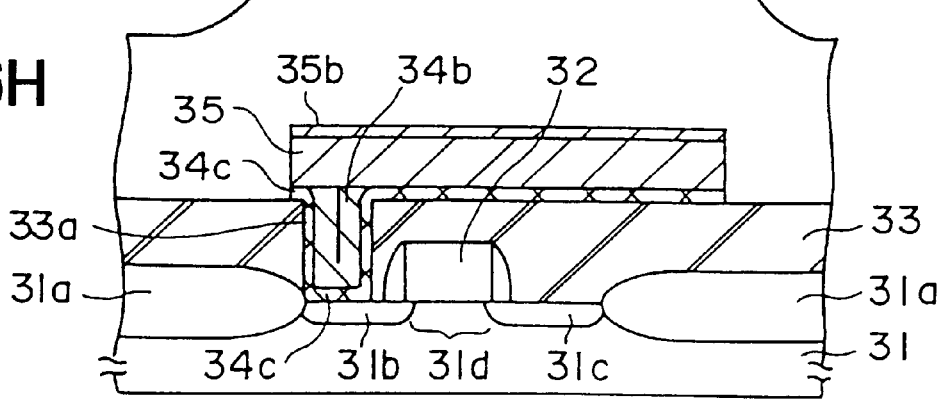
Figure 6L:
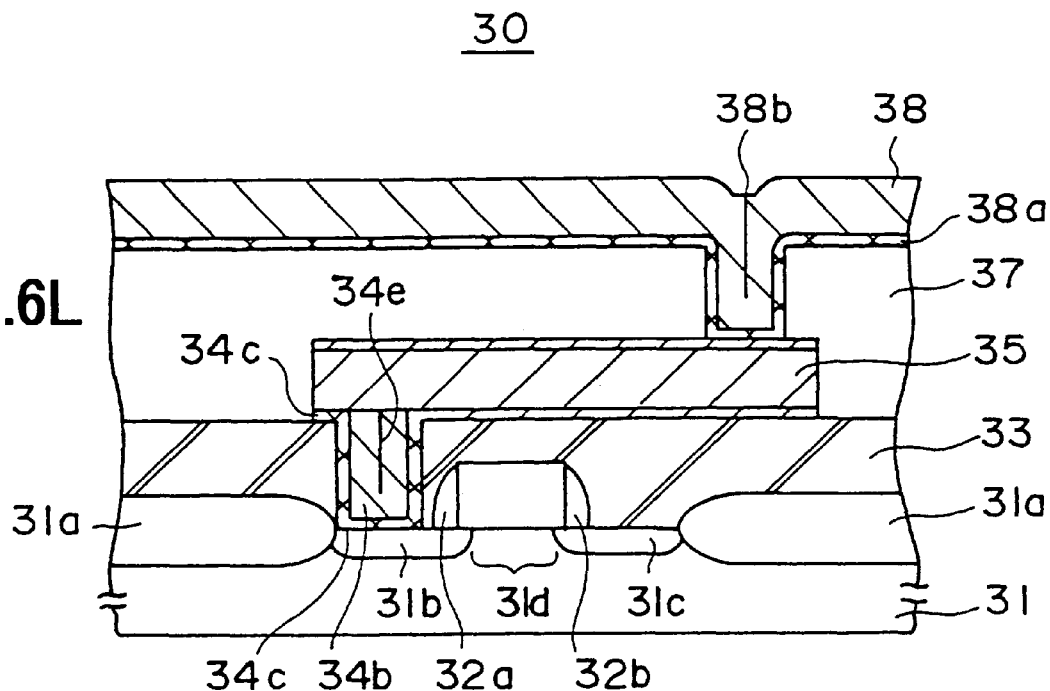

In addition, in this embodiment, the interlayer insulating film 36 of FIG. 6H is polished in the step of FIG. 6I until the TiN film 35b on the W pattern 35 is exposed, thereby planarizing the interlayer insulating film 36. The polishing process of FIG. 6I proceeds rapidly until the TiN film 35b on the W pattern 35 is exposed, and a thickness of the resulting interlayer insulating film 36 remaining on interlayer insulating film 33 is substantially regulated by the thickness of the W pattern 35. Since the thickness of the W pattern 35 is accurately controlled when the W film 35 is deposited by the CVD method in the step of FIG. 6F, it is possible to control a desired thickness of the interlayer insulating film 36 in accordance with the present invention accurately. In addition, if an appropriate selection is given to abrasives, for example, manganese oxides, in the process of polishing, the TiN/Ti film 35b may be effectively used as a polishing stopper. After the step of FIG. 6I, another interlayer insulating film 37 is deposited on the interlayer insulating film 36 planarized in the step of 6J. Since the surface of the interlayer insulating film 36 is substantially planarized by the previous polishing process, the interlayer insulating film 37 is deposited accurately to a desired thickness by means of the CVD method and the like.

Figure 6M:
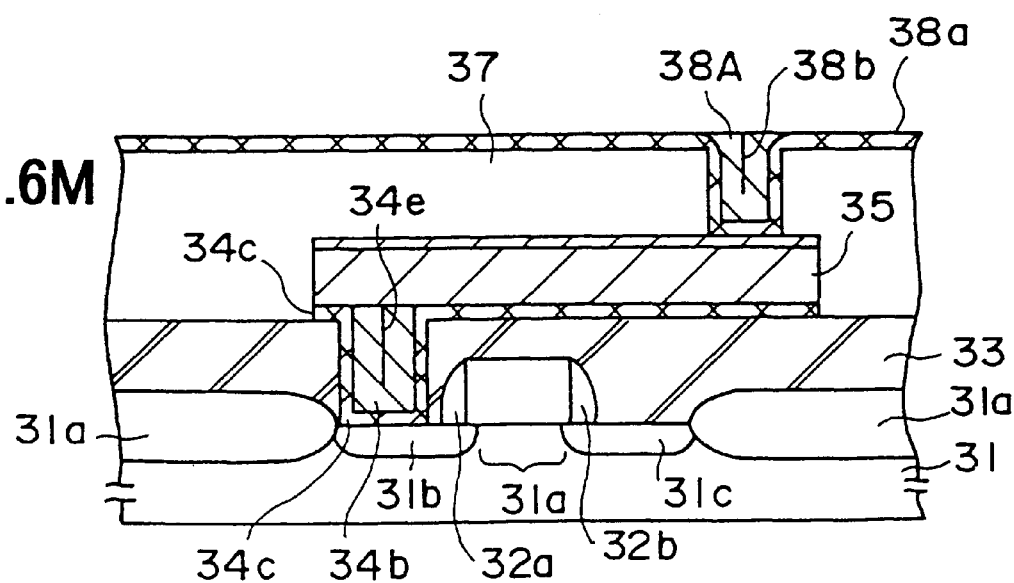

In the next step of FIG. 6K, a contact hole 37A is formed in the interlayer insulating film 37 to expose the conductive layer 35. In addition, a TiN layer 38a and a W layer 38 are deposited sequentially on the interlayer insulating film 37 in the step of FIG. 6L to fill the contact hole 37A. In the step of FIG. 6M, the deposited W layer 38 is then removed by the CMP method using, for example, manganese oxide abrasives, similarity to the FIG. 6E step, thereby forming a conductive plug 38A to fill the contact hole 37A. Furthermore, a wiring pattern and an interlayer insulating film are provided on the structure of FIG. 6M to complete the semiconductor device.

In the above embodiment, although the present invention is described with reference to the formation of the W wiring pattern in the multilayer interconnection structure, the present invention is not limited to such a particular structure and, for example, is also applicable to the formation of the gate electrode 22.

The present invention is not limited to the specifically disclosed embodiments, and variations and modifications may be made without departing from scope of the present invention.

The present application is based on Japanese priority application No. 10-313534 filed on Nov. 4, 1998, the entire contents of which are hereby incorporated by reference.

What is claimed is:

1. A method for fabricating a semiconductor device including a conductive film comprising a first layer including titanium and a second layer including tungsten, said method comprising the steps of:

patterning said conductive film by a dry etching using a resist mask so as to form a conductive pattern; and exposing said first layer and said second layer to a plasma containing oxygen after the patterning step;

wherein the step of exposing the conductive pattern to the plasma is accomplished after the step of the patterning but before the conductive pattern is exposed to the atmosphere.

2. The method as claimed in claim 1, wherein the second layer is formed on the first layer.

3. The method as claimed in claim 1, wherein said plasma containing O is formed in a gas selected from the group consisting of $O_2$ and $O_3$ under a condition identical to that of an oxygen plasma RIE process.

4. The method as claimed in claim 1, wherein the patterning step comprises the steps of:

dry etching the second layer in an etching gas including F so as to form a W pattern; and dry etching the first layer in an etching gas including Cl so as to form a Ti pattern, said W pattern and said Ti pattern forming said conductive pattern.

5. A method for fabricating a semiconductor device including a conductive film comprising a first layer including titanium and a second layer including tungsten, said method comprising the steps of:

patterning said conductive film by a dry etching using a resist mask so as to form a conductive pattern; and exposing said first layer and said second layer to a plasma containing hydrogen after the patterning step;

wherein the step of exposing the conductive pattern to the plasma is accomplished after the step of the patterning but before the conductive pattern is exposed to the atmosphere.

6. The method as claimed in claim 5, wherein the second layer is formed on the first layer.

7. The method as claimed in claim 5, wherein said plasma containing H is formed in gas selected from the group consisting of $H_2$ $H_2O$, $NH_3$, and $CH_4$.

8. The method as claimed in claim 5, wherein the patterning step comprises the steps of:

dry etching the second layer in an etching gas including F so as to form a W pattern; and dry etching the first layer in an etching gas including Cl so as to form a Ti pattern, said W pattern and said Ti pattern forming said conductive pattern.

9. A method for fabricating a semiconductor device including a conductive film comprising a first layer including titanium and a second layer including tungsten, said method comprising the steps of:

patterning said conductive film by a dry etching using a resist mask so as to form a conductive pattern; and exposing said first layer and said second layer to a plasma containing fluorine after the patterning step;

wherein the step of exposing the conductive pattern to the plasma is accomplished after the step of the patterning but before the conductive pattern is exposed to the atmosphere.

10. The method as claimed in claim 9, wherein the second layer is formed on the first layer.

11. The method as claimed in claim 9, wherein said plasma containing F is formed in a gas selected from the group consisting of $NF_3$, $SF_6$, $CF_4$, $CHF_3$, $C_2F_6$, $CH_2F_2$, and $C_4F_8$.

12. The method as claimed in claim 9, wherein said plasma containing F is formed in Freon gas which is given by a chemical formula $C_xH_yF_z$ ($x \geq 1$, $y \geq 0$, $z \geq 1$) and does not substantially include Cl, Br, or I.

13. The method as claimed in claim 9, where the patterning steps comprises the steps of:

dry etching the second layer in an etching gas including F so as to form a W pattern; and dry etching the first layer in an etching gas including Cl so as to form a Ti pattern, said W pattern and said Ti pattern forming said conductive pattern.

* * * * *